United States Patent [19]
Byun

[11] Patent Number: 5,668,040
[45] Date of Patent: Sep. 16, 1997

[54] METHOD FOR FORMING A SEMICONDUCTOR DEVICE ELECTRODE WHICH ALSO SERVES AS A DIFFUSION BARRIER

[75] Inventor: Jeong Soo Byun, Chungcheongbuk-do, Rep. of Korea

[73] Assignee: LG Semicon Co., Ltd., Chungcheongbuk-do, Rep. of Korea

[21] Appl. No.: 601,621

[22] Filed: Feb. 14, 1996

Related U.S. Application Data

[63] Continuation of Ser. No. 437,228, May 8, 1995, abandoned.

[51] Int. Cl.⁶ .................................................. H01L 21/283
[52] U.S. Cl. .......................... 438/396; 438/653; 438/686
[58] Field of Search .......................... 437/60, 919, 190, 437/192, 200; 257/306, 751, 757; 361/305, 321.5

[56] References Cited

U.S. PATENT DOCUMENTS

| | | | |
|---|---|---|---|
| 4,959,745 | 9/1990 | Suguro | 361/311 |
| 5,053,917 | 10/1991 | Miyasaka et al. | 361/321 |
| 5,191,510 | 3/1993 | Huffman | 361/313 |
| 5,262,920 | 11/1993 | Sakuma et al. | 361/321.5 |
| 5,293,510 | 3/1994 | Takenaka | 257/295 |
| 5,352,623 | 10/1994 | Kamiyama | 437/52 |
| 5,366,920 | 11/1994 | Yamamichi et al. | 437/52 |
| 5,381,302 | 1/1995 | Sandhu et al. | 361/305 |
| 5,382,817 | 1/1995 | Kashihara et al. | 257/295 |
| 5,392,189 | 2/1995 | Fazan et al. | 361/305 |
| 5,466,629 | 11/1995 | Mihara et al. | 437/60 |

OTHER PUBLICATIONS

Al-Shareef, H., et al., "Bottom Electrodes for Ferroelectric Thin Films," Proceedings of 4th Int. Symp. on Integrated Ferr., Mar. 1992, pp. 181–196.

"Diffusion Barriers for Cu Metallization on Silicon", 1994 Materials Research Society, pp. 31–47.

"Electrodes for PbZr$_x$Ti$_{1-x}$O$_3$ Ferroelectric Thin Films", D.P. Vijay et al., J. Electrochem. Soc., vol. 140, No. 9, Sep. 1993, pp. 2640–2645.

"Effect of Barrier Layers on BaTiO$_3$ Thin Film Capacitors on Si Substrates", Q.X. Jia et al., Journal of Electronic Materials, vol. 23, No. 1, 1994, pp. 53–56.

*Primary Examiner*—T. N. Quach
*Attorney, Agent, or Firm*—Finnegan, Henderson, Farabow, Garrett & Dunner, L.L.P.

[57] ABSTRACT

A capacitor element includes a pervoskite dielectric film and an electrode having excellent electrical contact characteristic and improved adhesion to an underlying surface. In a method for fabricating the electrode, a group IVB or VB refractory metal transition element is deposited on a silicon substrate or a silicon oxide layer. A group VIII near noble metal transition element is then deposited on the group IVB or VB refractory metal layer. The substrate and deposited layers is then subjected to a heat treatment in an ammonia ambient to form a refractory metal nitride layer between the refractory metal and near noble metal layers. In addition, if the refractory metal is deposited on a silicon substrate, a silicide layer is formed between the refractory metal layer and the substrate during heat treatment. If, however, the refractory metal layer is provided on a silicon oxide layer, a refractory metal oxide is formed during the heat treatment. Examples of group IVB refractory metal transition elements include Ti, Zr and Hf; examples of group VIII refractory metal transition elements include Fe, Co, Ni, Ru, Rh, Pd, Os, Ir, and Pt; and examples of the group VB refractory metals include V, Nb, and Ta.

11 Claims, 7 Drawing Sheets

*PRIOR ART*

METHOD FOR FORMING A SEMICONDUCTOR DEVICE ELECTRODE WHICH ALSO SERVES AS A DIFFUSION BARRIER This application is a continuation of application Ser. No. 08/437,228, filed May 8, 1995, now abandoned.

BACKGROUND OF THE INVENTION

The present invention is directed toward a capacitive element and a related method. In particular, the present invention is related to a capacitor element including a pervoskite dielectric thin film, having a top electrode formed of a near noble metal, such as platinum or palladium, and a bottom electrode having a silicide or refractory metal oxide/refractory metal/refractory metal nitride/near noble metal multilayered structure. Preferably, the refractory metal nitride consists of large grains with significant amounts of oxygen being present at the grain boundaries and is formed by a heat treatment in an $NH_3$ ambient. In addition, the refractory metal is selected from the group IVB or VB transition metals and the near noble metal is one of the group VIIIB transition metals. The bottom electrode in accordance with the present invention has improved diffusion barrier and electrical contact characteristics.

DISCUSSION OF THE PRIOR ART

Future generations of semiconductor memories will likely include metal wiring layers formed of copper, and dielectric materials such as PZT ($PbZr_xTi_{1-x}O_3$) or BST ($BaSrTiO_3$). Although these materials have excellent electrical properties, they tend to react with silicon. Accordingly, it is necessary to first form a diffusion barrier before depositing these materials on a silicon substrate. The diffusion barrier prevents leakage caused by reaction with the silicon substrate.

Cobalt, chromium, palladium, titanium nitrite, neobidium nitrite lc, are well-known diffusion barriers for copper. In addition, titanium or titanium nitride is typically used as a diffusion barrier for electrode materials (e.g., BST or PZT). These electrode materials often include near noble metals such as platinum or palladium, or a conductive oxide film such as $RuO_2$. The diffusion barrier in this case, not only inhibits interdiffusion, but also enhances adhesion between the electrode and the substrate.

Diffusion barriers must satisfy several criteria. Namely, the diffusion barriers should be stable and not react with a copper electrode, for example, or paraelectric dielectrics. In addition, the diffusion barriers should be strongly resistant to oxidation and be highly electrically conductive. Further, the diffusion barrier should have excellent adhesion to the underlying substrate. It is noted that the near noble transition metals in group VIIIB or chromium, which is typically used as a capacitor electrode, have low barrier properties even though they are strongly resistant to oxidation, are stable due to their low reactive force, and have excellent electrical conductivity.

Group VB or IVB transition refractory metals have excellent adhesive force, and the refractory metal nitrides serve as excellent diffusion barriers and have high electrical conductivity.

Figure 9:
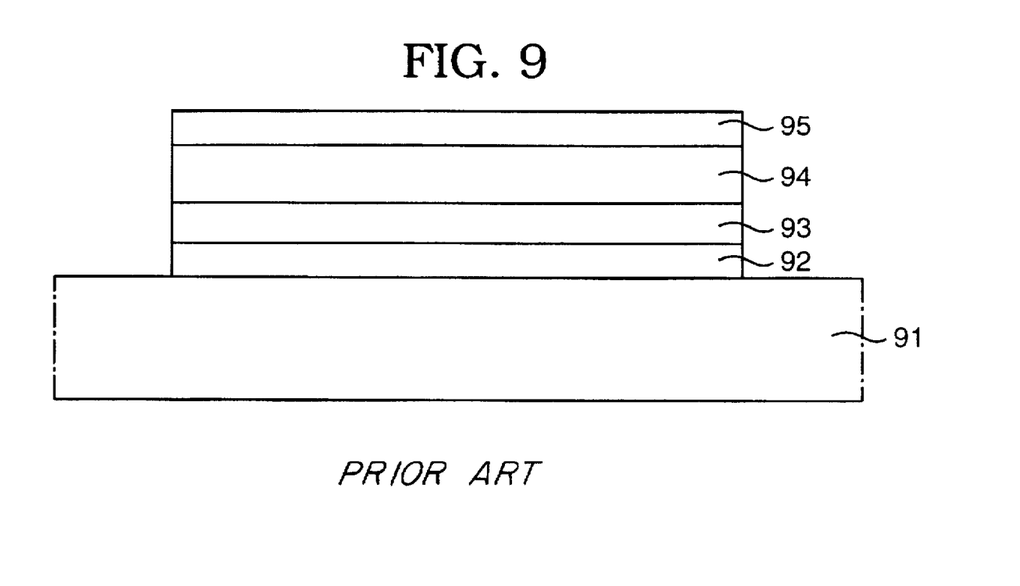
FIG. 9 is an electrode structure for a capacitor having a conventional pervoskite dielectric.

FIG. 9 illustrates a conventional capacitor including a pervoskite dielectric film. As seen in FIG. 9, the conventional capacitor includes a titanium film 92 provided on a layer 91 which may be a layer of silicon dioxide or a silicon substrate. Platinum or near noble metal film 93, pervoskite dielectric film 94 and platinum or near nobel metal film 95 are then formed successively on titanium film 92.

Figure 8:
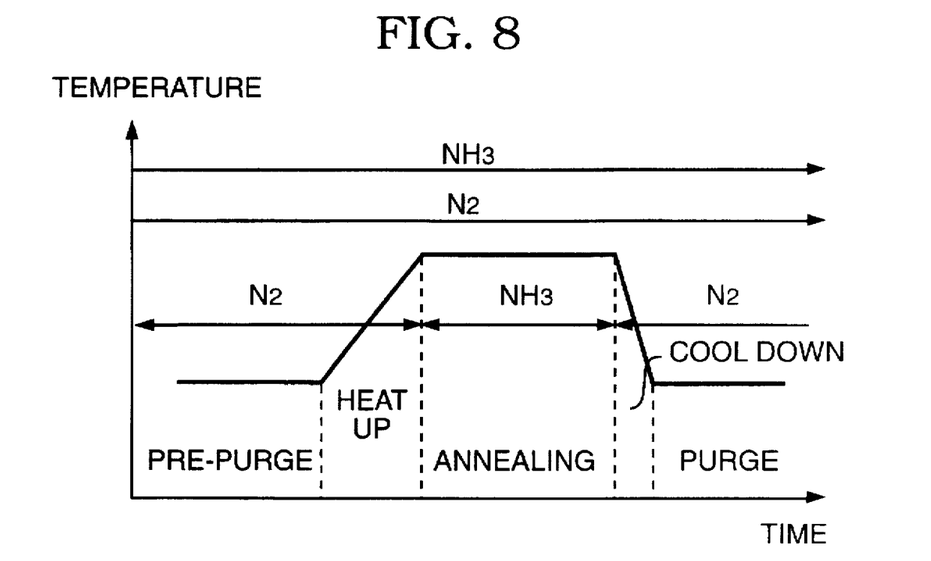
FIG. 8 illustrates various phases during a heat treatment process used to form the electrodes illustrated in FIGS. 1A–1B and 2A–2B.

FIG. 8 is a plot showing variations in temperature over time and gas flow during a heat treatment process for fabricating the capacitor shown in FIG. 9. As further shown in FIG. 8, this heat treatment process can be divided into a prepurge step, a heat-up step, an annealing step, a cooling down step, and a purge step. Each of these steps can be carried out in an $N_2$ ambient. Alternatively, the heat treatment process can be carried out in $N_2$ ambient for all of the steps with the exception of the annealing step, which may be carried out in an $NH_3$ ambient.

In the above described heat treatment processes, the prepurge step is performed in a nitrogen ambient. Since platinum layer 93 is in contact with titanium layer 92, nitrogen tends to mix with the platinum instead of reacting with the titanium to form an effective diffusion barrier of titanium nitride. Accordingly, platinum readily diffuses from layer 93 during high temperature steps of the heat treatment process.

This problem also occurs when the capacitor is formed on a silicon oxide film. Again, during the prepurge step shown in FIG. 8, nitrogen reacts with electrode layer 93 instead of titanium film 1. An effective diffusion barrier formed of titanium nitride, therefore, is not formed.

Moreover, noble metals such as palladium and platinum are expensive. Therefore, the cost of fabricating a conventional capacitor including these materials is high. In addition, other nobel metal-containing materials, such as $RuO_2$, are unstable and, therefore, difficult to pattern. Thus, it is also difficult to form electrodes of a material such as $RuO_2$.

SUMMARY OF THE INVENTION

The object of this invention is to provide a method for forming a capacitor electrode for a semiconductor device, which has excellent diffusion barrier properties, as well as an excellent adhesive force. The method may be implemented with conventional semiconductor processing equipment used for making conventional capacitor electrodes.

If a refractory metal film and a near nobel metal film are to be deposited on a silicon oxide film, a nitride film is formed between the refractory metal film and the near noble metal film for improving diffusion barrier characteristics, and a refractory metal oxide film is formed between the refractory metal film and the silicon oxide film for improving adhesion to the silicon oxide film.

BRIEF DESCRIPTION OF THE DRAWINGS

FIGS. 5A–5C show AES depth analyses of Co/Zr double layer films, wherein

FIGS. 7A–7B show an AES depth analysis of a CoCr double layered film deposited on a silicon dioxide substrate and heat treated at 700 Deg. C., wherein

DETAILED DESCRIPTION OF THE INVENTION

A method for forming a capacitor electrode which also serves as a diffusion barrier in a semiconductor device in accordance with the present invention will now be explained in detail with reference to the attached drawings.

Figure 1A:
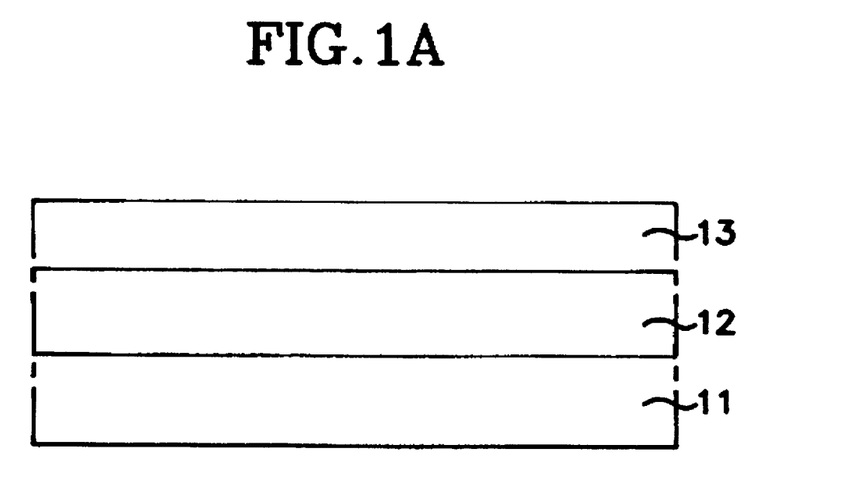
FIGS. 1A–1B illustrate process steps for forming an electrode of a semiconductor device which also serves as a diffusion barrier in accordance with a first embodiment of the present invention.
Figure 1B:
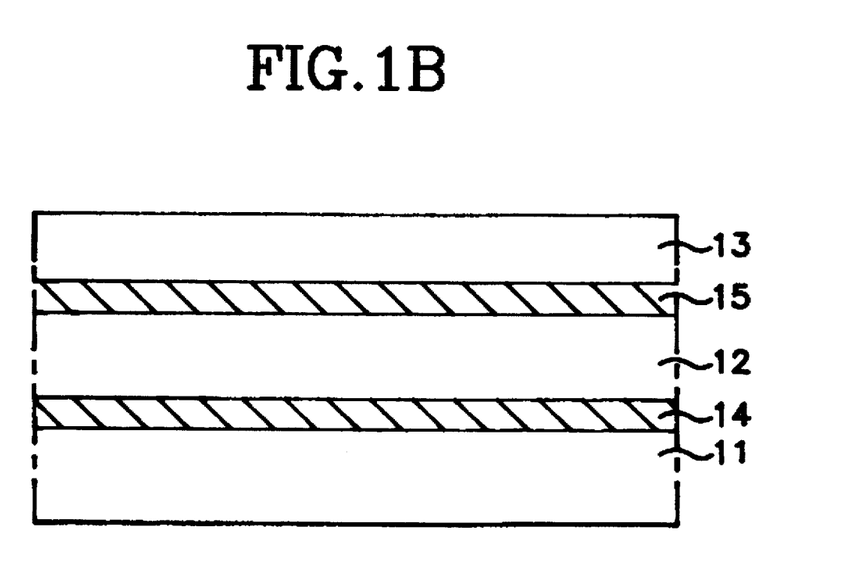

FIGS. 1A–1B illustrate process steps for forming an electrode which also serves as a diffusion barrier in a semiconductor device in accordance with a first embodiment of the present invention.

As shown in FIG. 1A, a group IVB or VB refractory metal transition element layer 12 is deposited on a silicon substrate 11. A layer 13, including a group VIII near noble metal transition element, is formed on layer 12.

Film 12 may be formed of a metal selected from the group including titanium, zirconium, or hafnium, vanadium, niobium, and tantalum. Film 13 may be formed of a metal selected from the group including iron, cobalt, nickel, Ru, Rh, palladium, osmium, iridium, and platinum.

As shown in FIG. 1B, the refractory metal film 12 and near noble metal film 13 formed successfully on substrate 11 are subjected to a heat treatment in an ammonia ambient. In contrast to the conventional method, however, the method in accordance with the present invention carries out the deposition of films 12 and 13 in an ammonia ambient during the prepurge step. Accordingly, as shown in FIG. 1B, the heat treatment process in accordance with the present invention causes a refractory metal nitride film 15 to be formed at the interface between refractory metal layer 12 and the near noble metal layer 13.

Preferably, the refractory metal layer 12 and the near noble metal film 13 are each deposited to a thickness of 10–1,000 angstroms, and heat treated at a temperature of 500–1,000 Deg. C. Near noble metals do not strongly react to form nitride films. Refractory metals, however, strongly react to form nitride films. Accordingly, when the refractory metal layer 12 and the near noble metal 13 are subjected to a heat treatment in an ammonia ambient, nitrogen diffuses through the near noble metal film 13 to the refractory metal layer 12 and reacts to form a refractory metal nitride film 15 at the interface of films 12 and 13.

Figure 3:
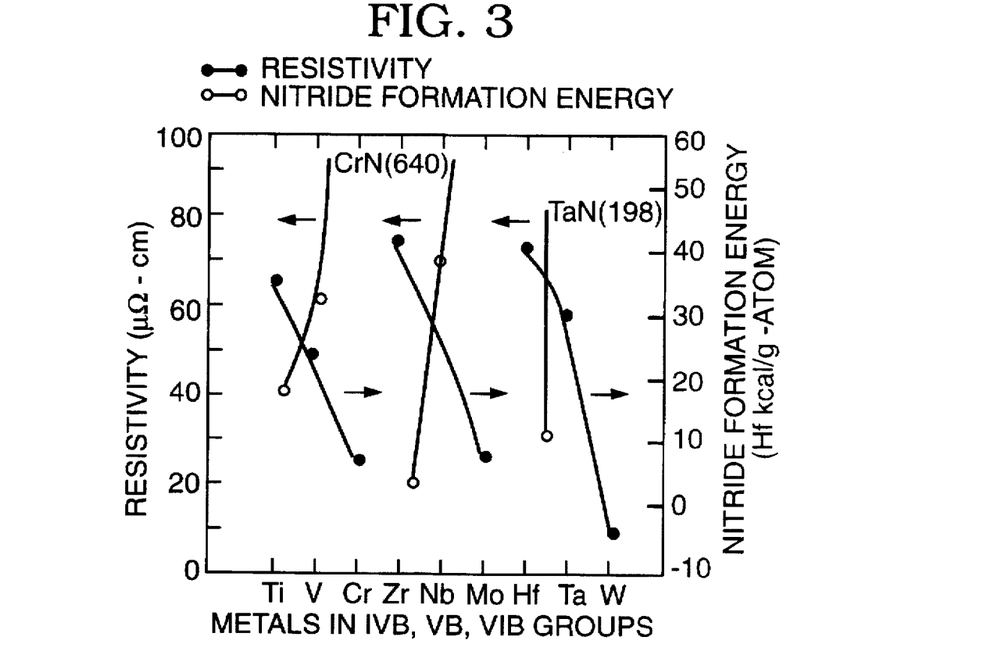
FIG. 3 is a graph showing nitride formation energies and resistivities of various group IVB, VB, VIB refractory metal transition elements.

FIG. 3 is a graph illustrating nitride formation energies and resistivities of various group IVB, VB, VIB refractory metal transition elements. As shown in FIG. 3, refractory metals having greater stability also have a correspondingly high nitride formation energy, while possessing lower resistivities. Accordingly, these refractory metals are very suitable as electrical contacts. This is particularly true with the group IVB and VB refractory metals, and specifically titanium, zirconium, and hafnium have high nitride formation energies and relatively low resistivities. The group VIII near noble metals discussed above, do not readily form nitrides because they have a positive nitride formation energy.

The above described refractory metals are also advantageous because during the heat treatment they react with silicon substrate 11 to form a refractory silicide layer 14 at the interface thereof with refractory metal film 12. The silicide layer further reduces contact resistance.

Thus, a bottom capacitor electrode fabricated in accordance with the process steps illustrated in FIGS. 1A–1B has a multilayered structure including refractory metal film 12, refractory metal nitride film 15, and near noble metal film 13. A pervoskite dielectric film can then be formed in a conventional manner on the bottom electrode, and a top electrode formed of a near nobel metal or chromium can then be formed on the pervoskite dielectric film to form a capacitor structure. The capacitor in accordance with the present invention has a reduced contact resistance as well as improved contact properties because a refractory metal silicide layer is formed at the interface of the substrate in the refractory metal film. Moreover, the bottom electrode of the capacitor has improved diffusion barrier properties and electrical conductivity due to the presence of the refractory metal nitride film.

As discussed above, in accordance with the present invention, ammonia gas is introduced into the reaction chamber during the prepurge step of the heat treatment process. A comparison of electrodes formed during a heat treatment process in which the prepurge step is performed with a nitrogen ambient and a prepurge step is performed in an ammonia ambient will now be described. By way of example, this comparison will be made for cobalt and zirconium deposited films on substrate 11 in which refractory metal film 12 is made of cobalt and near noble metal film 13 is made of zirconium. The comparison will be discussed with reference to FIGS. 5A–5C and FIG. 6. The cobalt and zirconium films were subjected to a heat treatment in which the prepurge step was performed in a nitrogen ambient in one case and an ammonia ambient in another.

Figure 5A:
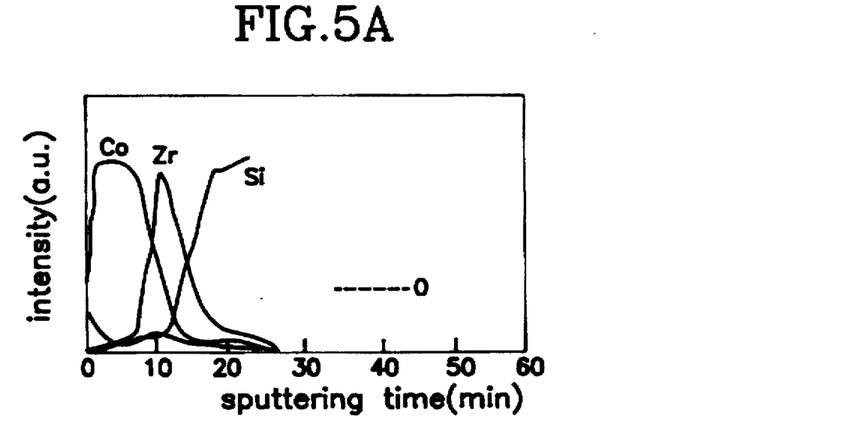
FIG. 5A is a depth analysis after deposition.
Figure 5B:
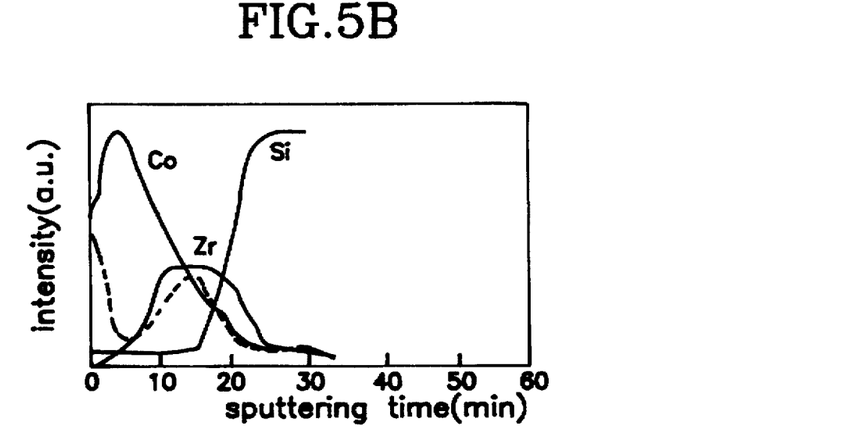
FIG. 5B is a depth analysis after heat treatment at 500 Deg. C. in a nitrogen ambient.
Figure 5C:
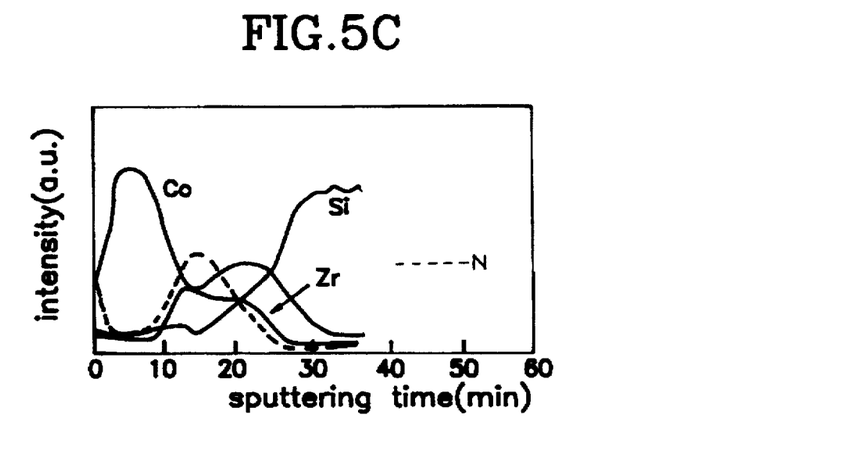
FIG. 5C is a depth analysis after heat treatment at 600 Deg. C. in a nitrogen ambient.

FIGS. 5A–5C show an AES depth analysis of the cobalt/ zirconium double layered film deposit on the silicon substrate, wherein FIG. 5A illustrates the depth analysis after the deposition but before the heat treatment, FIG. 5B illustrates the depth analysis after the heat treatment at 500 Deg. C and a nitrogen ambient, FIG. 5C is the depth analysis after heat treatment at 600 Deg. C and a nitrogen ambient. As shown in FIGS. 5B and 5C, when the cobalt/zirconium deposited films are subjected to a heat treatment and a nitrogen ambient at 500 Deg. C. and of 600 Deg. C. respectively, an intralayer mixture is formed between the cobalt and zirconium layers.

Figure 6:
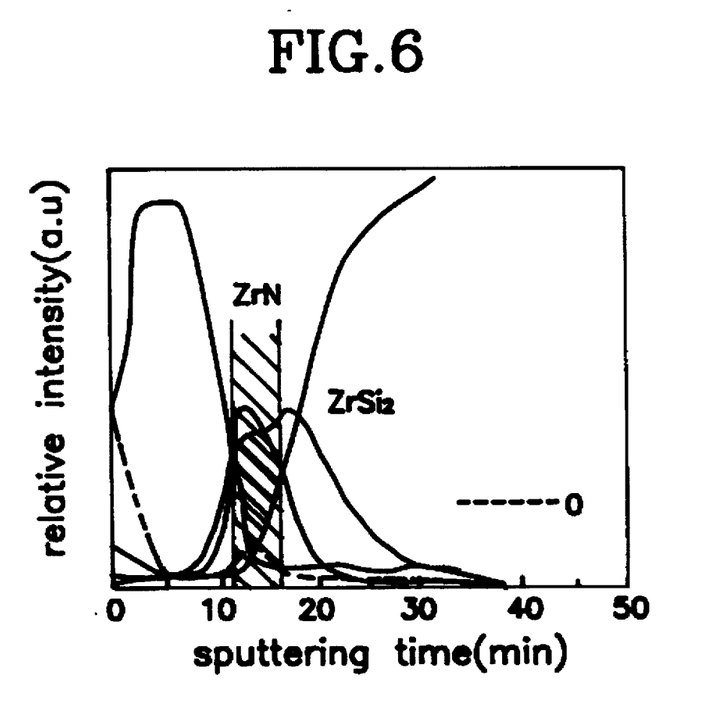
FIG. 6 illustrates an AES depth analysis of a Co/Zr double layered film formed by introducing ammonia into the reaction chamber after a purge step in the heat treatment at 700 Deg. C.

In accordance with the present invention however, when the cobalt/zirconium double layered film is subjected to a heat treatment at 700 Deg. C. while ammonia is introduced into the reaction chamber during the prepurge step, nitrogen diffuses through the near noble metal film 13 and reacts with the refractory metal film 12, which, in this case is formed of zirconium as shown in FIG. 6. As a result, a refractory metal nitride film 15 is formed on the surface of refractory metal film 12 under the near noble metal film 13. In addition, a refractory metal silicide layer 14 is formed at the interface of silicon substrate 11 and refractory metal film 12. Further, unlike the conventional method in which the cobalt and zirconium mix at the interface of layers 12 and 13 even at temperatures lower than 500 Deg. C, the cobalt and zirconium layers do not mix during the heat treatment step in accordance with the present invention even at temperatures in excess of 700 Deg. C.

Figure 2A:
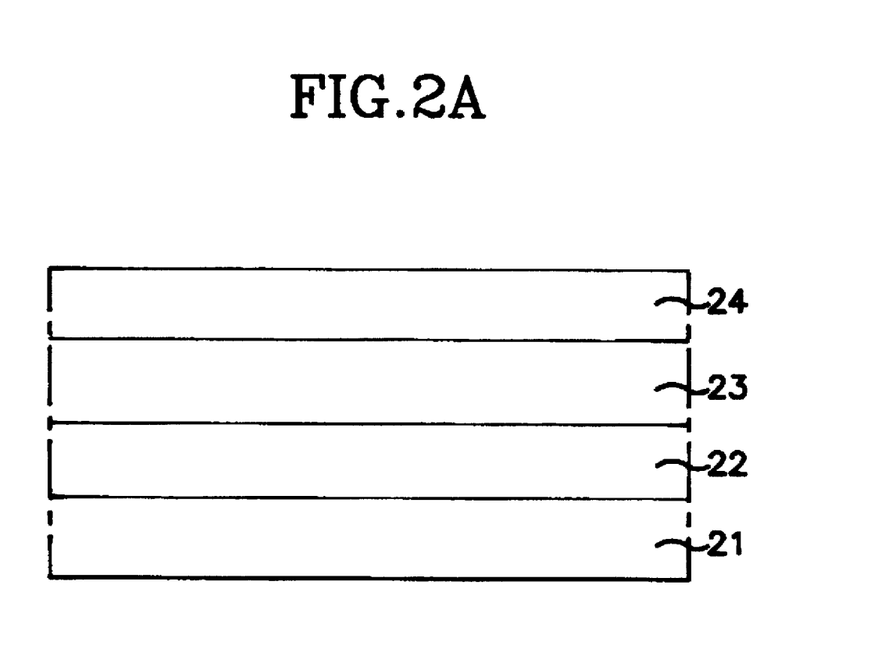
FIGS. 2A–2B show process steps for forming an electrode in a semiconductor device which also serves as a diffusion barrier in accordance with a second embodiment of the present invention.
Figure 2B:
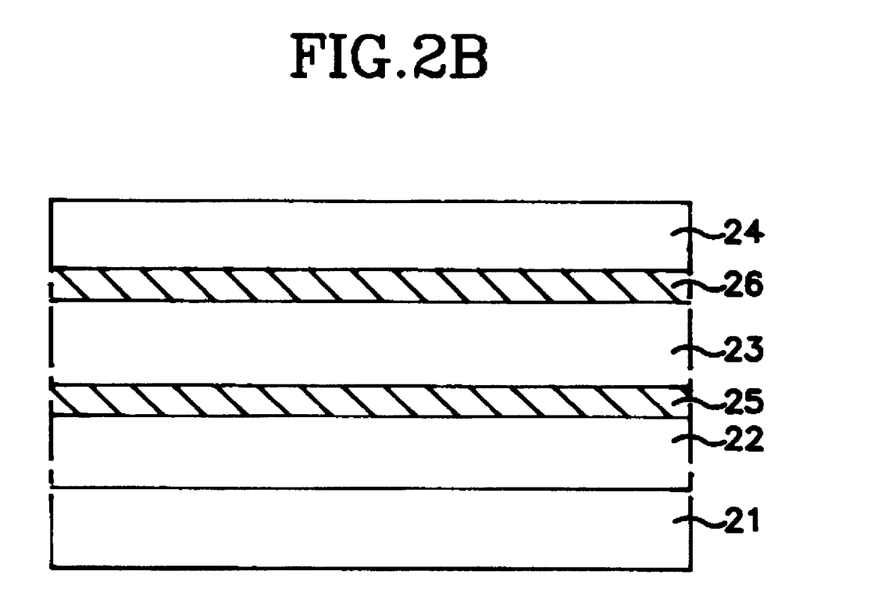

FIGS. 2A–2B illustrate process steps for forming an electrode which serves as a diffusion barrier in accordance with a second embodiment of the present invention.

As shown in FIG. 2A, a silicon oxide film 22 is deposited on silicon substrate 21. A film 23 of a group IVB or VB refractory metal transition element is then deposited on oxide film 22. In addition, a film 24 formed of a group VIII near noble metal transition element is deposited on film 23.

As in the first embodiment of the present invention, the group IVB transition element metal used to form film 23 may be titanium, zirconium, or hafnium. Alternatively, film 23 may be formed of a group VB transition element metal, such as vanadium, niobium, or tantalum. In any event, film 23 is preferably formed of a refractory metal. Film 24, on the other hand, is preferably formed of a group VIII near noble metal transition element such as iron, cobalt, nickel, Ru, Rh, palladium, osmium, iridium, or platinum.

As shown in FIG. 2B, the refractory metal layer 23 and near noble metal layer 24 are subjected to a heat treatment in an ammonia ambient. The heat treatment process is carried out while introducing ammonia gas during the prepurge step.

As a result of the above described heat treatment process, a refractory metal nitride film 26 is formed at the interface of refractory metal film 23 and near noble metal film 24. In particular, during the heat treatment process, nitrogen diffuses through noble film 24 to react with refractory metal film 23 to form the refractory metal nitride film 26. Refractory metal nitride film 26 is highly conductive and also serves as an excellent diffusion barrier. In addition, as noted above, since nitrogen does not react with near noble metal films, the nitrogen that diffuses through the near noble metal film 24 reacts with the refractory metal film and not with noble metal film 24 itself.

Figure 4:
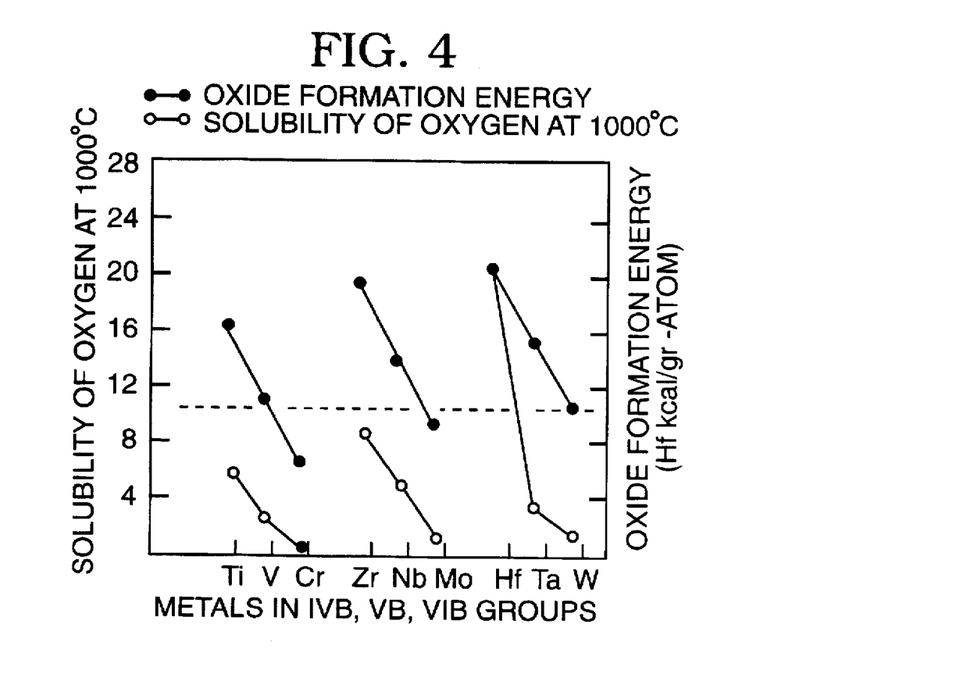
FIG. 4 is a graph showing oxide formation energies and solubilities of oxygen at 1,000 Deg. C. for group IVB, VB, VIB refractory metal transition elements.

Further, refractory metal film 23 and silicon oxide film 22 react to form a refractory metal oxide film 25 between film 23 and oxide film 22. FIG. 4 is a graph illustrating oxide formation energies and oxygen solubilities of group IVB, VB, VIB refractory metal transition elements. As shown in FIG. 4, a silicon oxide film reduced by a group IVB or VB refractory metal yields a refractory metal oxide that is much more stable than silicon oxide and has excellent adhesion to silicon oxide film 22. Adhesion of the near noble metal film 24 to the silicon oxide film is not as good as the refractory metal oxide because of the lower oxide formation energy (absolute value) of the near noble metal relative to the silicon oxide film. Accordingly, as noted above, conventional electrodes formed only of a near noble metal are disadvantageous because they do not adhere well to silicon oxide films.

In accordance with the present invention, however, this problem has been overcome by providing a refractory metal oxide film 25 at the interface of refractory metal film 23 and silicon oxide film 22. As noted above, the refractory metal film 23 is provided under near noble metal film 24. The refractory metal oxide film is formed during the heat treatment.

Figure 7A:
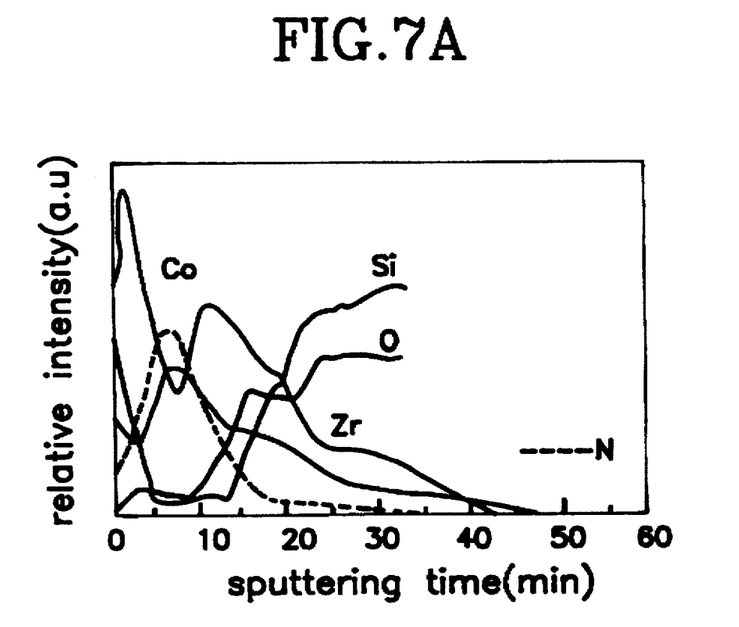
FIG. 7A is a depth analysis in a nitrogen ambient.
Figure 7B:
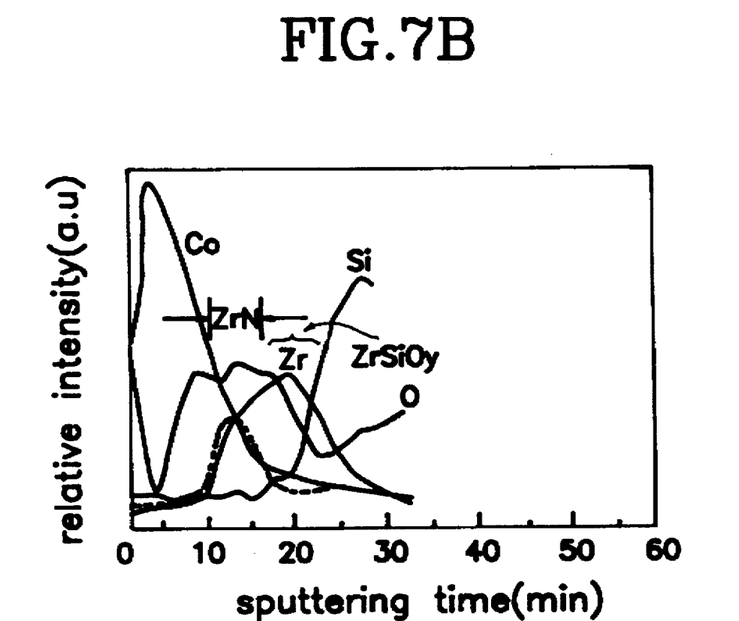
FIG. 7B is a depth analysis in an ammonia ambient.

FIGS. 7A–7B show an AES depth analysis of a cobalt/zirconium double layer film deposited on a silicon dioxide substrate and heat treated at 700 Deg. C, wherein FIG. 7A is a depth analysis in a nitrogen ambient and FIG. 7B is a depth analysis in an ammonia ambient. As shown in FIG. 7A, when the cobalt/zirconium double layer film is heat treated in a nitrogen ambient, an interlayer mixture of cobalt and zirconium is formed at the interface of these two films, as in FIGS. 5A–5C discussed above. When the cobalt/zirconium double layer film is heat treated in an ammonia ambient, however, zirconium nitride is formed at the interface of the cobalt and zirconium layers. The layer of zirconium nitride serves as a diffusion barrier. Also during the heat treatment, $ZrSi_xO_y$ is formed at the interface of the silicon oxide film and the zirconium layer. The $ZrSi_xO_y$ layer improves adhesion to the silicon oxide film.

After heat treatment, the refractory metal film 23, refractory metal film nitride film 26, and near nobel metal film 24 can collectively constitute a bottom electrode of a capacitor. Thus, by providing a pervoskite dielectric film on near noble metal film 24 and a second near noble metal film, such as platinum on the pervoskite dielectric film, a capacitor element can be formed. The cobalt/zirconium double layer films discussed above in conjunction with FIGS. 5A–7B are only exemplary. The present invention is applicable to all near noble metals/refractory metal double layer films.

As discussed above, the present invention can provide an electrode having excellent diffusion barrier properties as well as good contact characteristics. In summary, a near noble refractory metal layer is deposited on a refractory metal layer on a silicon substrate or a silicon oxide surface and then subjected to a heat treatment in an ammonia ambient during the prepurge step and preferably extending throughout the heat treatment process. Moreover, this invention can provide an electrode having excellent diffusion barrier properties and a good adhesive force to silicon oxide by depositing a near noble metal/refractory metal double layer film on a silicon oxide layer and subjecting the resulting structure to a heat treatment in an ammonia ambient during a prepurge step and preferably extending throughout a heat treatment process.

Although the invention has been described in conjunction with specific embodiments, it is evident that many alternatives or variations will be apparent to those skilled in the art in light of the foregoing description. Accordingly, the invention is intended to embrace all of the alternatives or variations that fall within the spirit and scope of the appended claims.

What is claimed is:

1. A method of forming a semiconductor device comprising the steps of:

depositing a first layer including a refractory metal transition element on a substrate;

depositing a second layer including a group VIII near noble metal transition element on said first layer;

subjecting said first and second layers to a heat treatment, said heat treatment including a pre-purge step;

exposing said first and second layers to an ammonia ambient at least during said pre-purge step of said heat treatment;

forming a third layer including a dielectric material on said second layer;

forming a fourth layer on said third layer, said fourth layer including a group VIII metal transition element, wherein during said heat treatment, a nitride film is formed between said first and second layers and a silicide film is formed between said first layer and said substrate.

2. A method of forming a semiconductor device according to claim 1, wherein said first and second layers are exposed to said ammonia ambient throughout said heat treatment.

3. A method of forming a semiconductor device according to claim 1, wherein said semiconductor device is a capacitor element and said first and second layers and said silicide and nitride films constitute a portion of a first electrode of said capacitor, and said fourth layer constitutes a second electrode of said capacitor.

4. A method of forming a semiconductor device according to claim 1, wherein said first layer has a thickness in a range of 10–1000 Angstroms and said second layer has a thickness in a range of 10–1000 Angstroms.

5. A method of forming a semiconductor device according to claim 1, wherein said heat treatment is performed at a temperature in a range of 500°–1000° C.

6. A method of forming a semiconductor device according to claim 1, wherein said first layer includes a group IVB refractory metal transition element.

7. A method of forming a semiconductor device according to claim 1, wherein said first layer includes a group VB refractory metal transition element.

8. A method of forming a semiconductor device according to claim 1, wherein said first layer includes a metal selected from the group of titanium, zirconium, and hafnium.

9. A method of forming a semiconductor device according to claim 1, wherein said second layer includes a metal selected from the group of iron, cobalt, nickel, Ru, Rh, palladium, osmium, iridium, and platinum.

10. A method of forming a semiconductor device according to claim 1, further comprising a step of depositing a silicon oxide film on said substrate prior to said step of depositing said first layer.

11. A method of forming a semiconductor device according to claim 10, wherein a refractory metal oxide film is formed between said first layer and said silicon oxide film during said heat treatment.

* * * * *